United States Patent
Tanner et al.

(10) Patent No.: US 10,106,885 B2
(45) Date of Patent: Oct. 23, 2018

(54) HEAT ASSISTED MAGNETIC RECORDING HEAD HAVING NEAR-FIELD TRANSDUCER WITH A SLOPED NOSE

(71) Applicant: WESTERN DIGITAL (FREMONT), LLC, Fremont, CA (US)

(72) Inventors: Shawn M. Tanner, San Jose, CA (US); Mingjun Yu, Sunnyvale, CA (US); Min Zheng, Milpitas, CA (US); Kyung Lee, Fremont, CA (US); Tsung Yuan Chen, San Ramon, CA (US)

(73) Assignee: WESTERN DIGITAL (FREMONT), LLC, Fremont, CA (US)

(*) Notice: Subject to any disclaimer, the term of this patent is extended or adjusted under 35 U.S.C. 154(b) by 0 days.

(21) Appl. No.: 15/703,108

(22) Filed: Sep. 13, 2017

(65) Prior Publication Data

US 2018/0005650 A1    Jan. 4, 2018

Related U.S. Application Data (63) Continuation of application No. 15/199,540, filed on Jun. 30, 2016, now Pat. No. 9,786,304.

(51) Int. Cl.
| | |
|---|---|
| *G11B 11/00* | (2006.01) |
| *C23C 14/58* | (2006.01) |
| *G11B 5/31* | (2006.01) |
| *G11B 5/855* | (2006.01) |
| *G11B 5/00* | (2006.01) |
| *G11B 5/60* | (2006.01) |

(52) U.S. Cl.
CPC .......... *C23C 14/5873* (2013.01); *G11B 5/314* (2013.01); *G11B 5/3116* (2013.01); *G11B 5/3163* (2013.01); *G11B 5/855* (2013.01); *G11B 5/6088* (2013.01); *G11B 2005/0021* (2013.01)

(58) Field of Classification Search
None
See application file for complete search history.

(56) References Cited

U.S. PATENT DOCUMENTS

| | | | |
|---|---|---|---|
| 8,619,514 B1* | 12/2013 | Matsumoto | G11B 5/314 369/13.33 |
| 9,786,304 B1* | 10/2017 | Tanner | G11B 5/3169 |
| 2011/0235480 A1 | 9/2011 | Goulakov et al. | |
| 2011/0294398 A1 | 12/2011 | Hu et al. | |
| 2014/0254339 A1 | 9/2014 | Zhao et al. | |
| 2015/0043315 A1* | 2/2015 | Chen | G11B 5/314 369/13.33 |
| 2015/0055441 A1 | 2/2015 | Rejda et al. | |

(Continued)

OTHER PUBLICATIONS

Notice of Allowance on U.S. Appl. No. 15/199,540 dated Jun. 13, 2017.

*Primary Examiner* — Tan X Dinh
(74) *Attorney, Agent, or Firm* — Foley & Lardner LLP (57) ABSTRACT

A magnetic write apparatus includes a pole and a near field transducer. The pole extends in a yoke direction from a media facing surface where the yoke direction extends perpendicular to the media facing surface. The near field transducer includes a near field transducer cap and a near field transducer nose. The near field transducer nose is separated from the pole by the near field transducer cap and a dielectric gap and the near field transducer nose comprises a bevel surface that forms a bevel angle with a plane extending in the yoke direction.

20 Claims, 12 Drawing Sheets

(56) References Cited

U.S. PATENT DOCUMENTS

| | | | |
|---|---|---|---|
| 2015/0371669 A1 | 12/2015 | Lee et al. | |
| 2016/0125901 A1* | 5/2016 | Lee | G11B 5/3133 369/13.33 |
| 2016/0133286 A1* | 5/2016 | Lee | G11B 5/3133 369/13.33 |
| 2016/0351209 A1* | 12/2016 | Chen | G11B 5/314 |
| 2017/0032811 A1* | 2/2017 | Chen | G11B 5/6082 |
| 2017/0047088 A1 | 2/2017 | Matsumoto et al. | |
| 2017/0194022 A1* | 7/2017 | Natarajarathinam | G11B 5/1272 |

* cited by examiner

HEAT ASSISTED MAGNETIC RECORDING HEAD HAVING NEAR-FIELD TRANSDUCER WITH A SLOPED NOSE

CROSS-REFERENCE TO RELATED APPLICATION

This application is a continuation of U.S. application Ser. No. 15/199,540, filed on Jun. 30, 2016, the entirety of which is incorporated by reference herein.

BACKGROUND

A conventional heat assisted magnetic recording (HAMR) transducer typically includes at least a waveguide, a near-field transducer (NFT), a main pole and a coil for energizing the main pole. The conventional HAMR writer uses light, or energy, received from a laser in order to write to a magnetic recording media. Light from the laser is incident on and coupled into the waveguide. Light is guided by the waveguide to the NFT near the air-bearing surface (ABS). The NFT focuses the light to magnetic recording media, such as a disk. This region is thus heated. The main pole is energized and field from the pole tip is used to write to the heated portion of the recording media.

Although the conventional HAMR writer functions, improvements in performance are still desired. For example, the location of the hot spot on the media, temperature gradient and distance between the media hot spot and the write pole are desired to be controlled.

DETAILED DESCRIPTION OF THE PREFERRED EMBODIMENTS

While the various embodiments disclosed herein are applicable to a variety of data storage devices such as magnetic recording disk drives, solid-state hybrid disk drives, networked storage systems etc., for the sake of illustration the description below will use disk drives as examples.

Figure 1:
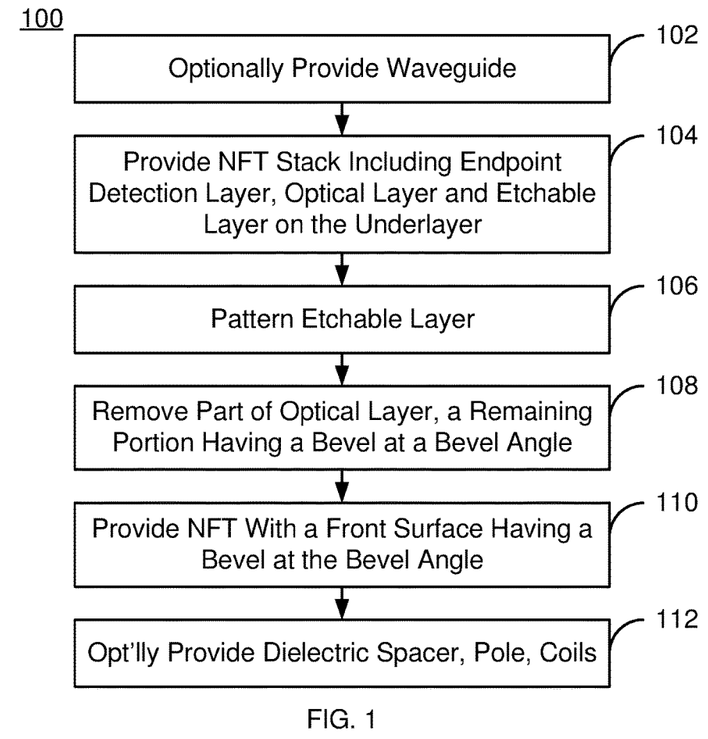
FIG. 1 is a flow chart depicting an exemplary embodiment of a method for fabricating a HAMR write apparatus.

FIG. 1 is a flow chart depicting an exemplary embodiment of a method 100 for fabricating a heat assisted magnetic recording (HAMR) write apparatus. For simplicity, some steps may be omitted, performed in another order, interleaved and/or combined. The HAMR data storage device being fabricated may include a write apparatus and a read apparatus and resides on a slider. For simplicity, however, the read apparatus is not discussed. The method 100 is also described in the context of forming a single write apparatus. However, the method 100 may be used to fabricate multiple apparatuses at substantially the same time. The method 100 and system are also described in the context of particular layers. However, in some embodiments, such layers may include multiple sub-layers. Further, formation of only a portion of the HAMR data storage device and write apparatus are described. The method 100 also may commence after formation of other portions of the data storage device.

A waveguide may optionally be provided, via step 102. Step 102 may include depositing a layer of core material on a cladding layer, patterning the core material and refilling the region with an additional cladding layer. However, other methods may be used. The waveguide is used to direct light from the laser or other light source toward the media-facing surface (MFS) of the HAMR write apparatus. For example, in a HAMR disk drive, the waveguide may direct light from the laser toward the air-bearing surface (ABS).

A stack for a near-field transducer (NFT) is provided on an underlayer, via step 104. The underlayer may be the core of the waveguide. In alternate embodiments, the underlayer may be a thin cladding layer on the waveguide core or other layer. The stack includes an endpoint detection layer, an optical layer on the endpoint detection layer and an etchable layer on the optical layer. The optical layer may be silicon oxide. The etchable layer may be aluminum oxide. The endpoint detection layer may be tantalum or tantalum oxide.

The stack may also include an additional optical layer. In such embodiments, the endpoint detection layer is between the optical layer and the additional optical layer. Thus, the additional optical layer is closer to the underlayer than the endpoint detection layer. The stack may also include a hard mask layer and an adhesion layer. In such embodiments, the adhesion layer is between the etchable layer and the optical layer. The etchable layer is between the adhesion layer and the hard mask layer. The hard mask layer is, therefore, at the top of the stack in such embodiments. The adhesion layer may be Rh, Cr, a bilayer of Rh/Cr and/or another material.

The etchable layer is patterned, via step 106. In some embodiments, the etchable layer may be considered to form a mask. A portion of the mask may be at a MFS location. The MFS location includes the positions at which the MFS is formed. For a disk drive the MFS location may be the position to which the slider is lapped and the MFS formed. In embodiments in which a hard mask layer is not present in the stack, the etchable layer is patterned using a reactive ion etch (RIE). In embodiments in which the stack includes the hard mask layer and the adhesion layer, the hard mask and adhesion layers are also patterned in step 106. In such embodiments, the etchable layer may be patterned using an ion mill. Thus, the etchable layer may have a bevel formed during step 106.

A portion of the optical layer is removed, via step 108. This portion is exposed by the mask formed in step 106. Step 108 may include ion milling the stack at an ion milling angle. A remaining portion of the optical layer has a bevel at a bevel angle from the MFS location. This bevel angle is nonzero and acute. The bevel angle may be at least twenty degrees and not more than seventy degrees. In some such embodiments, the bevel angle is at least forty degrees and not more than sixty degrees. The ion milling angle may be within five degrees of the bevel angle desired. The ion milling is terminated in response to detection of the endpoint detection layer. Thus, steps 104-106 prepare the surface under the NFT that is to be formed.

The NFT is provided, via step 110. Step 110 includes providing an NFT that has an NFT front surface adjoining the bevel and at the bevel angle from the MFS location. In some embodiments, step 110 includes full-film depositing at least one NFT material, such as Au or an Au alloy. This material may be deposited to a thickness greater than the final thickness of the NFT. A portion of the NFT material(s) is removed from a side of the mask formed in step 106. For example, an ion mill at a nonzero angle from the MFS location may be used. The NFT material(s) is removed faster from the side of the mask than from a surface of the NFT material that is substantially perpendicular to the MFS location. Stated differently, a portion of the NFT material(s) may be removed faster from the mask bevel than from a surface of the NFT material substantially perpendicular to the MFS location. The mask formed from the etchable layer may then be removed using one or more wet etches. For example, if the etchable layer is aluminum oxide, then an aluminum oxide wet etch may be performed as part of step 110. Additional NFT material(s) may be deposited and the NFT patterned. The NFT front surface adjoining the bevel and at the bevel angle from the MFS location may be formed. The NFT provided in step 110 thus has a sloped surface near the MFS.

Any dielectric spacers, the pole, coil(s) for energizing the pole and other portions of the HAMR write apparatus are fabricated, via step 112. Thus, the remainder of the HAMR write apparatus may be manufactured.

Figure 2A:
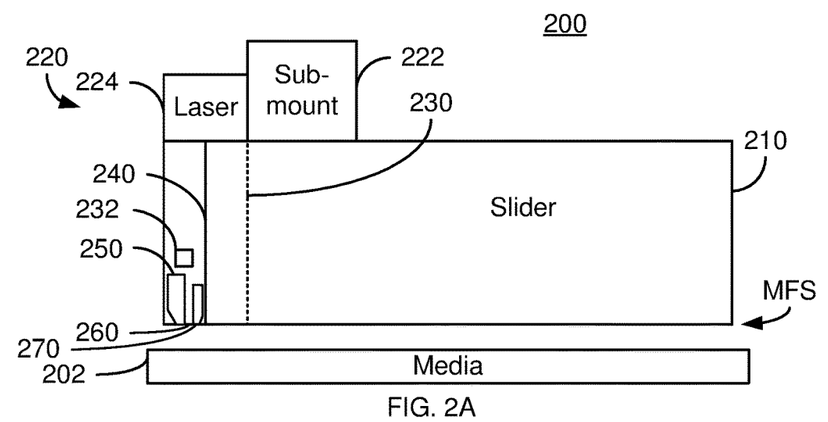
FIGS. 2A and 2B are diagrams depicting a side view of an exemplary embodiment of a HAMR disk drive and an apex view of a portion of the HAMR write apparatus.
Figure 2B:
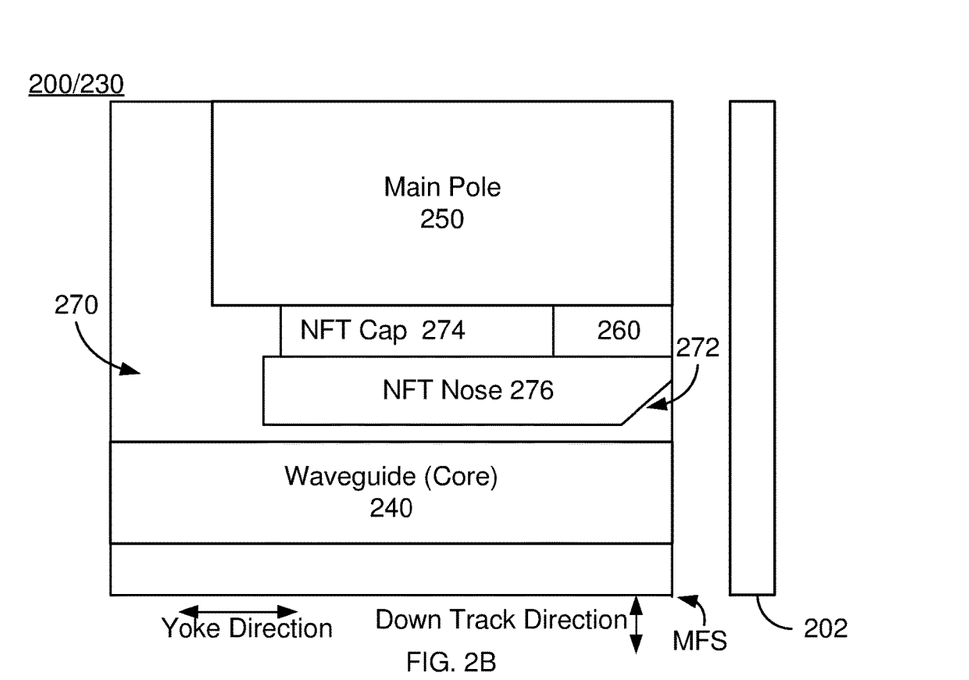

FIGS. 2A and 2B depict a side view of an exemplary embodiment of a HAMR data storage device 200 and a closer apex view of the HAMR write apparatus 230. In the embodiment shown, the data storage device is a disk drive 200. For clarity, FIGS. 2A and 2B are not to scale. For simplicity not all portions of the HAMR disk drive 200 are shown. In addition, although the HAMR disk drive 200 is depicted in the context of particular components other and/or different components may be used. For example, circuitry used to drive and control various portions of the HAMR disk drive 200 are not shown. For simplicity, only single components are shown. However, multiples of each component and their sub-components, might be used.

The HAMR disk drive 200 includes media 202, a slider 210, a laser subassembly 220 and a HAMR write apparatus 230. Additional and/or different components may be included in the HAMR disk drive 200. Although not shown, the slider 210, and thus the laser assembly 220 and HAMR write apparatus 230 are generally attached to a suspension. The laser assembly 220 includes a laser 222 and a submount 224. The submount 224 is a substrate to which the laser 222 may be affixed for improved mechanical stability, heat sinking, ease of manufacturing and better robustness. The laser 222 may be a chip such as a laser diode or other laser. Although not shown, the laser subassembly 220 may include a photodetector which samples light tapped from the waveguide of the HAMR write apparatus 230.

The HAMR write apparatus 230 is fabricated on the slider 210 and includes MFS proximate to the media 202 during use. Because the HAMR data storage device 200 is a disk drive, the MFS is an ABS. In some embodiments, the MFS is a different gas-bearing surface, e.g. helium. In general, the HAMR write apparatus 230 and a read apparatus are present in the HAMR data storage device 200. However, for clarity, only the HAMR write apparatus 230 is shown. The HAMR apparatus 230 includes coil(s) 232, a waveguide 240, write pole 250, an optional dielectric gap 260 and NFT 270. The waveguide 240 is optically coupled with the laser 222. In some embodiments the laser may be located in a position other than on the slider, but still optically coupled to the waveguide 240. The waveguide 240 carries light energy from the laser 222 toward the MFS. The NFT 270 couples a portion of this energy from the waveguide 240 to the media 202. The write pole 250 is energized by the coils 232 and writes to the heated portion of the media 202. The coil(s) 232 may be solenoidal or spiral (pancake) coils. Other components including but not limited to other poles and/or shields may also be present.

FIG. 2B depicts a close-up apex view of the HAMR write apparatus 230. Note that the structure labeled as the waveguide 240 may be considered to be the waveguide core. The surrounding cladding, though functionally part of the waveguide is not separately labeled in the drawings.

The dielectric gap 260 resides between a portion of the NFT 270 and the main pole 250 at and near the MFS. The NFT cap 274 covers the sides and the back (distal from the MFS) of the dielectric gap 260. Similarly, the NFT nose 276 adjoins the bottom of the dielectric gap 260. In the embodiment shown in FIGS. 2A-2B, therefore, the dielectric gap 260 is surrounded by the NFT 270 except for the surface that occupies the MFS. In some embodiments, the dielectric gap 250 is an oxide, such as silicon oxide. Thus, the dielectric gap 260 may be formed of the same optical material as the cladding of the waveguide 240. However, other dielectrics/oxides, including those not used in the waveguide 240, may be used. In general, the dielectric gap 260 may be desired to have a relatively low index of refraction. Consequently, the materials used in the core of the waveguide 240 might not be used for the dielectric gap 260. For reliability, the dielectric gap 260 materials are also desired to be able to sustain high temperatures developed in the region of the NFT 270 without breaking down. In addition, the dielectric gap 260 may be unlikely to allow for diffusion of surrounding materials, such as Fe in the pole 250 and/or Au in the NFT 270. In the embodiment shown, the width of the dielectric gap 260 is slightly less than that of the NFT nose 276. In some embodiments, the width of the dielectric gap 260 is substantially the same as the width of the NFT nose 276. However, other widths are possible. The dielectric gap 260 also has a thickness in the down track direction and a length in the yoke direction. In general, the thickness, width and length of the dielectric gap 260 may be similar to those of the NFT nose 276. However, in other embodiments, these features differ. In some embodiments, the dielectric gap 260 may be desired to be the same size as or larger than the NFT nose 276. In general, if the dielectric gap 260 extends further in the yoke direction, the thickness in the down track direction and/or the width in the cross-track direction may be reduced.

The NFT 270 includes an optional cap 274 and nose 276, each of which are formed using the method 100. The NFT 270 may include other portions that are not shown for clarity. The NFT cap 274 extends over a relatively large area, greater than the pole near the MFS. For example, the NFT cap 274 may be semicircular with a radius of approximately seven hundred through nine hundred nanometers. Other shapes and sizes are, however, possible. The NFT cap 274 aids in heat dissipation and provides a boundary for the optical field of the NFT. Part of the NFT cap 274 adjoins the pole 250 near the MFS. In other embodiments, however, the NFT cap 274 may be omitted.

The NFT nose 276 may be smaller than the NFT cap 274 and is formed using the method 100. In some embodiments, the NFT nose 276 is not more than fifty nanometers wide in the cross-track direction. In some such embodiments, the NFT nose 276 is nominally forty nanometers wide in the cross-track direction. In some embodiments the thickness of the NFT nose 276 in the down track direction is on the order of fifty nanometers through one hundred twenty-five nanometers. For example, in some embodiments, the NFT nose 276 is nominally one hundred nanometers thick. Other sizes are, however, possible.

The NFT nose 276 has a bevel 272 formed using the method 100. The bevel 272 may be at a bevel angle of at least twenty degrees and not more than seventy degrees from a direction perpendicular to the MFS (i.e. the yoke direction). In some such embodiments, the bevel angle is at least forty degrees and not more than sixty degrees. The bevel 272 is shown as flat. In practice, however, the bevel may be curved, or rounded. Although the bevel 272 extends to the MFS, a portion of the NFT nose 276 is parallel to and occupies part of the MFS. Stated differently, the top of the NFT nose 276 is separated from the bevel 272 by a short distance. In some embodiments, this portion of the NFT nose 276 is at least twenty nanometers thick. For example, this portion of the NFT nose 276 may be nominally thirty nanometers thick. In other embodiments, this distance may have another thickness. Such a thickness may prevent the NFT 270 from receding from the MFS during lapping or may reduce this recession.

The HAMR data storage device 200 formed using the method 100 may have improved performance. The NFT 270 couples the optical energy carried by the waveguide 240 into the media 202. The optical spot formed on the media 202 has a characteristic spot size, peak intensity location, and power gradient. The thermal spot on the media 202 has a corresponding size, peak temperature location and thermal gradient. The presence of the bevel 272 shifts the peak intensity location of the optical spot closer to the portion of the NFT 276 residing at the MFS. Thus, the optical spot is shifted closer to the main pole 250. The presence of the dielectric gap 260 between the NFT nose 276 and the main pole 250 may also shift the peak in the energy delivered to the media 202 by the NFT 270 in the down track direction. Thus, the peak may be closer to the main pole 250. In addition, the gradient in the energy may be higher on the side of the peak that is closer to the main pole 250.

Because the shape and location of the energy peak delivered to the media 202 have been changed, the heating of the media is also affected. In particular, the peak in temperature of the thermal spot for the media 202 is shifted in the down track direction to be closer to the main pole 250. Further, the temperature gradient for the thermal spot his higher closer to the main pole 250. Both the closer proximity to the main pole 250 and the higher thermal gradient are desirable. As a result, performance of the HAMR write apparatus 230 may be improved.

Figure 3:
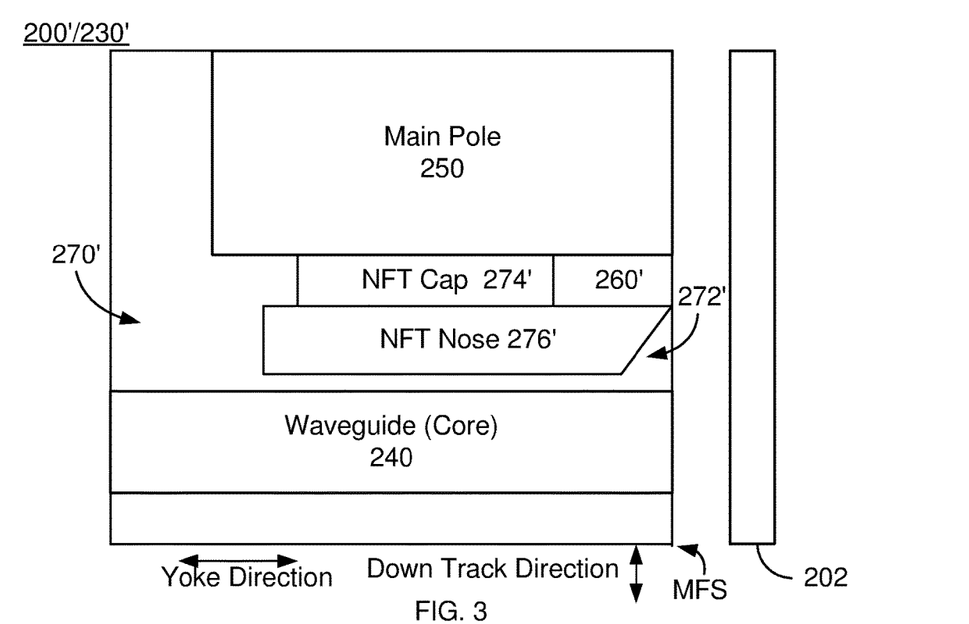
FIG. 3 is a diagram depicting an apex view of an exemplary embodiment of a portion of a HAMR write apparatus.

FIG. 3 depicts a close-up apex view of another exemplary embodiment of a portion of the HAMR disk drive 200' and write apparatus 230'. For clarity, FIG. 3 is not to scale. For simplicity not all portions of the HAMR disk drive 200' are shown. In addition, although the HAMR disk drive 200' is depicted in the context of particular components other and/or different components may be used. Further, the arrangement of components may vary in different embodiments. The HAMR disk drive 200' is analogous to the HAMR disk drive 200. Consequently, similar components have analogous labels. The HAMR write apparatus 230' thus includes waveguide 240, main pole 250, dielectric gap 260' and NFT 270' that are analogous to the waveguides 240, main pole 250, dielectric gap 260 and NFT 270, respectively. For clarity, components such as the laser, media, optional plasmonic ridge and other components are not shown.

The NFT 270' includes the NFT nose 276' and the optional NFT cap 274' that are analogous to the NFT nose 276 and NFT cap 274, respectively. In the embodiment shown, the NFT cap 274' does not extend as far in the yoke direction. In addition, the NFT nose 276' has bevel 272'. The bevel 272' extends to the top of the NFT nose 276'. Stated differently, the angle between the bevel 272' and the top of the NFT nose 276' may be the bevel angle described above.

The disk drive 200' and writer 230' share the benefits of the HAMR disk drive 200 and write apparatus 230. The bevel 272' results in the peak of the thermal profile of the optical spot being shifted in the down track direction toward the main pole 250. The presence of the dielectric gap 260' between a portion of the NFT 270' and the main pole 250 at and near the MFS shifts the thermal profile in the down track direction toward the main pole 250 for the HAMR write apparatus 230'. In addition, the gradient in the thermal profile may be increased. The isothermal lines in the cross-track direction may also be flattened. Thus, writing and reading for the write apparatus 230' and HAMR disk drive 200' may be improved.

Various features of the HAMR write apparatus, NFT, and dielectric gap are highlighted in FIGS. 2A-3. One of ordinary skill in the art will readily recognize that one or more of these features may be combined in manners not explicitly described herein.

Figure 4:
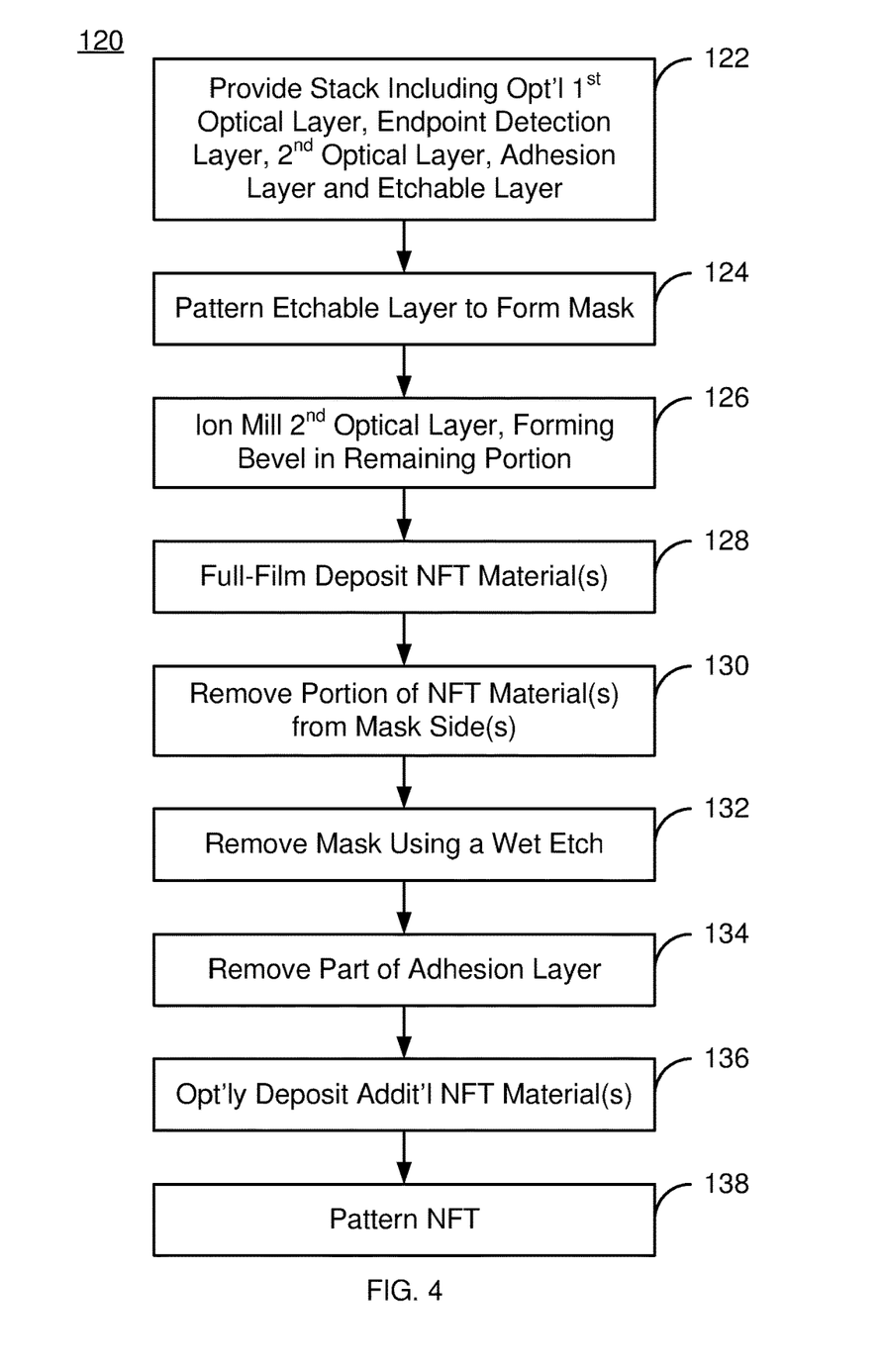
FIG. 4 is a flow chart depicting another exemplary embodiment of a method for fabricating a near-field transducer in a HAMR write apparatus.

FIG. 4 is a flow chart depicting an exemplary embodiment of a method 120 for fabricating a portion of a HAMR disk drive. For example, the method 120 may primarily be used in forming the NFTs 270 and/or 270'. FIGS. 5-10 depict apex views of another exemplary embodiment of a HAMR write apparatus 300 during fabrication using the method 120. For simplicity, some steps may be omitted, performed in another order, interleaved and/or combined. The HAMR write apparatus 300 being fabricated may be part of a data storage device that also includes a read apparatus (not shown) and may reside on a slider. For simplicity, however, the reader is not discussed. The method 120 is described in the context of forming the write apparatus 300. However, the method 120 may be used to fabricate multiple writers at substantially the same time. The method 120 and system are also described in the context of particular layers. However, in some embodiments, such layers may include multiple sub-layers. The method 120 also may commence after formation of other portions of the data storage device.

A stack for a NFT is provided on an underlayer, via step 122. The underlayer may be the core of the waveguide. The stack includes a first optical layer, an endpoint detection layer, a second optical layer, an adhesion layer, an etchable layer and a mask layer.

Figure 5:
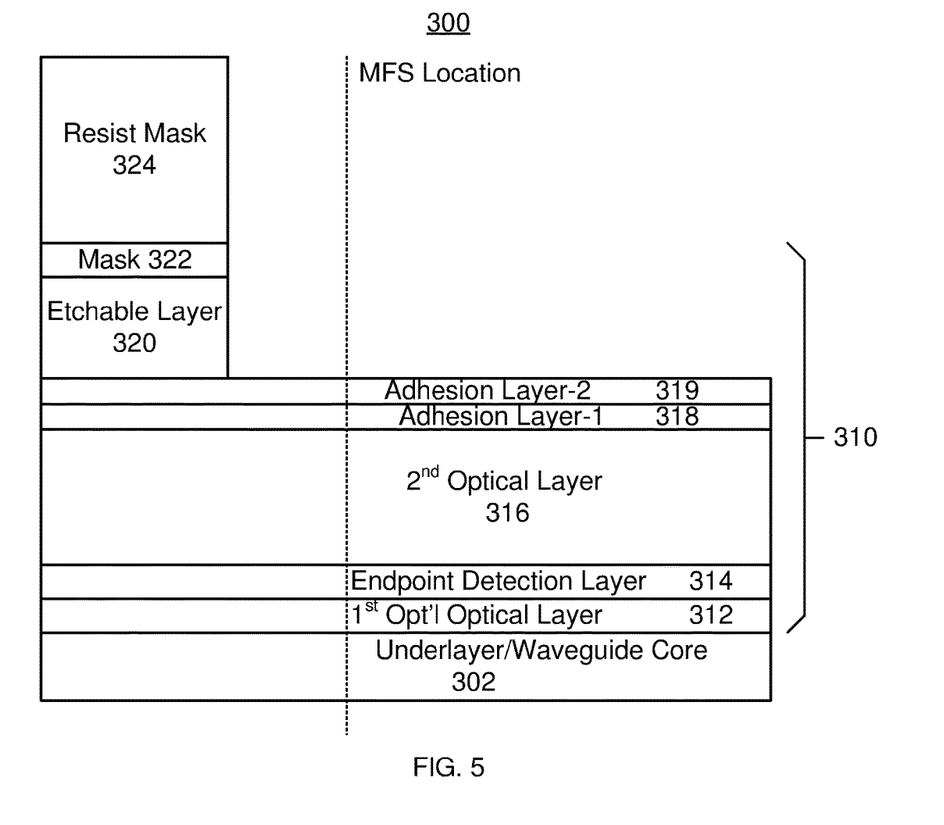
FIGS. 5-10 depict apex views of another exemplary embodiment of a HAMR write apparatus during fabrication.

The etchable layer is patterned to a mask, via step 124. Step 124 may include providing a photoresist mask and removing a portion of the etchable layer. For example, an RIE may be used. FIG. 5 depicts the HAMR write apparatus 300 after step 124. Thus, the stack 310 has been formed on the underlayer 302. The underlayer 302 is a waveguide core layer. The stack 310 includes the first optical layer 312, endpoint detection layer 314, second optical layer 316, adhesion layers 318 and 319, etchable layer 320 and mask layer 322. Also shown is the MFS location. The MFS location is the location at which the MFS will be located after fabrication is completed.

The optical layers 312 and 316 may be silicon oxide. The second optical layer 316 may be at least set based on the desired thickness of the bevel of the NFT and the total thickness of the NFT being formed. In some embodiments the silicon oxide layer 316 may be at least fifty nanometers and not more than one hundred nanometers thick. For example, the second optical layer 316 may be nominally seventy nanometers thick.

The etchable layer 320 may be aluminum oxide. In some embodiments, the etchable layer 320 may be at least one hundred and ten nanometers thick and not more than one hundred thirty nanometers thick. For example, the etchable layer 320 may be nominally one hundred twenty nanometers thick. The endpoint detection layer 314 may be tantalum or tantalum oxide. The adhesion layers 318 and 319 are a bilayer. Thus, adhesion layer 318 may be Rh and adhesion layer 319 may be Cr. The adhesion layers 318 and 319 aid in allowing NFT material(s) such as Au in adhering to the surface. The mask layer 322 may be a Ta layer. The waveguide core layer 302 may be tantalum oxide. Also shown is the resist mask 324 used in patterning the lower layer(s). The etchable layer 320 has been patterned, for example via a reactive ion etch (ME). Thus, the etchable layer 320 may form a mask for formation of the NFT. If the etchable layer 320 is defined by an RIE, then the back surface of the etchable layer 320 may be substantially parallel to the MFS location, as shown in FIG. 5.

Figure 6:
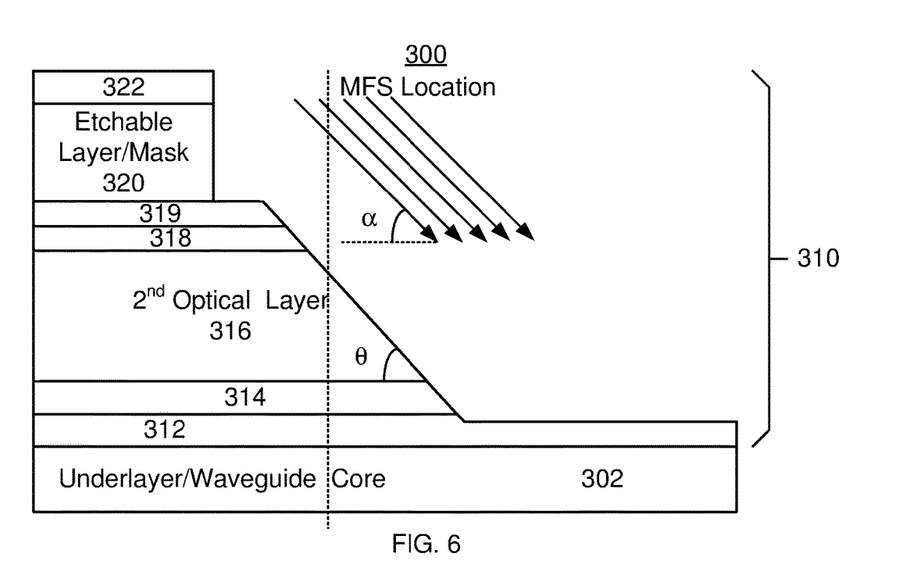

The stack 310 is ion milled at an ion milling angle, via step 126. Thus, at least the second optical layer 316 is milled. The ion milling angle is within five degrees of the desired bevel angle. The ion milling step is terminated in response to detection of the endpoint detection layer 314. In some cases, the endpoint detection layer 314 is milled through. FIG. 6 depicts the HAMR write apparatus 300 while step 126 is performed. Thus, the arrows depict the direction of the ion mill at angle α from perpendicular to the MFS. The adhesion layers 318 and 319 and, more importantly, the remaining portion of the second optical layer 316, have a bevel at a bevel angle, θ, at and near the MFS location. The MFS location is the location at which the MFS will be located after fabrication is completed. The bevel angle is at least forty degrees and not more than seventy degrees. The ion milling angle, α, is within five degrees of the bevel angle, θ. The layer 316 has this bevel even though the mask 320 formed by the etchable layer may have sidewalls that are vertical.

Figure 7:
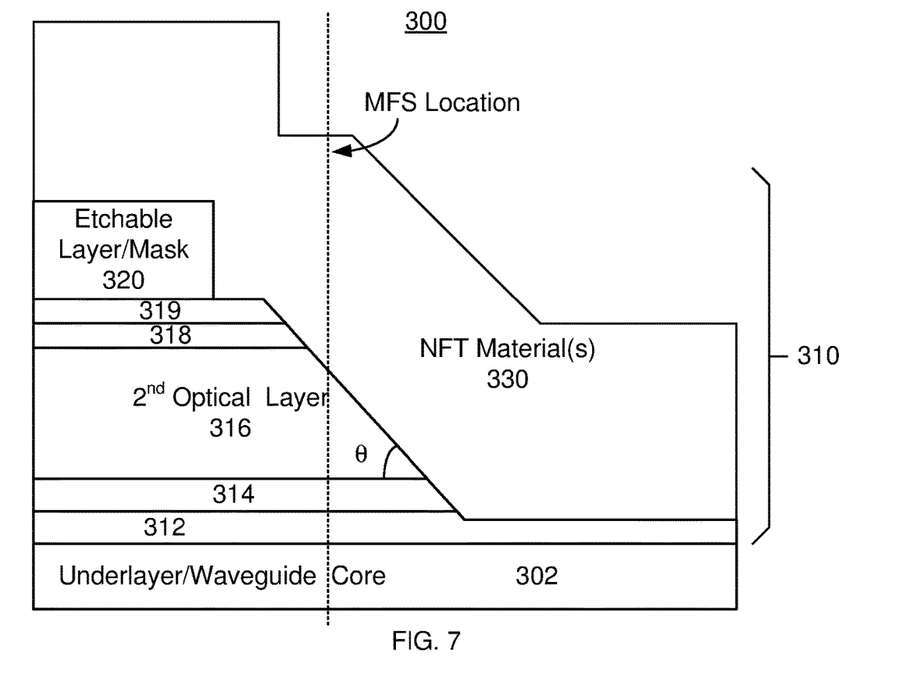

The NFT material(s) are full-film deposited, via step 128. Step 128 may include plating or otherwise depositing materials such as Au used in the NFT. FIG. 7 depicts the HAMR write apparatus 300 after step 128 is performed. Thus, NFT material(s) 330 are shown. A front surface of the material(s) adjoins, or shares an interface with, the bevel of the optical layer 316. Thus, this front surface of the NFT material(s) 330 is at the bevel angle, θ, from the MFS location.

Figure 8:
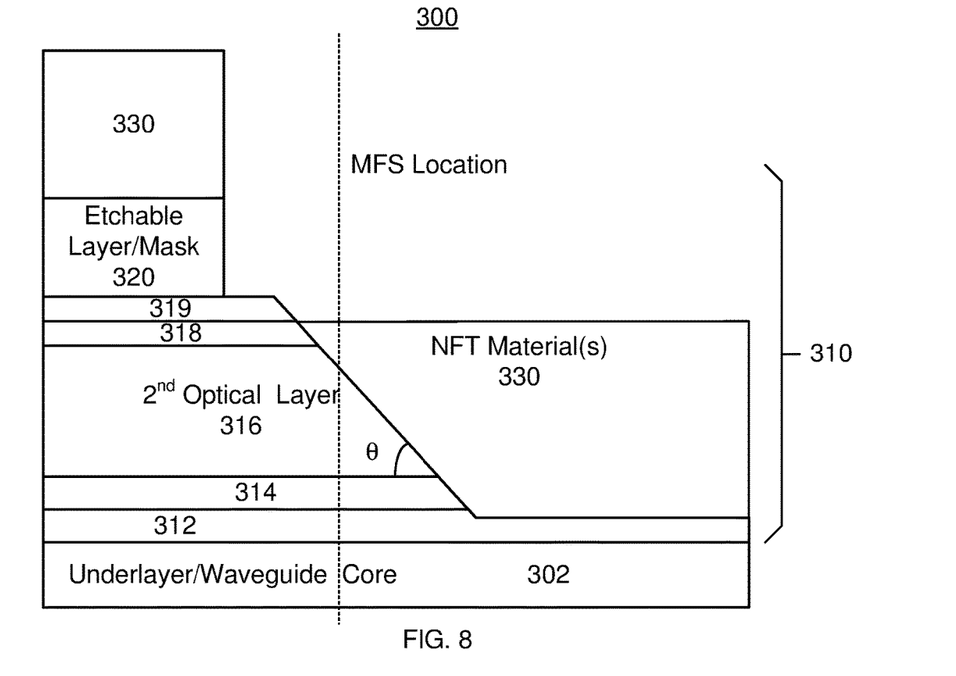

A portion of the NFT material(s) 330 are removed from a side of the mask 320, via step 130. Step 130 may include performing an ion mill at an acute angle from the MFS location. FIG. 8 depicts the HAMR write apparatus 300 after step 130 is performed. The portion of the NFT material(s) 330 on the side of the mask 320 are removed faster than the portions of the NFT material(s) 330 on the layers 316 and 312 and on the top of the mask 320. Thus, the NFT material(s) 330 still remain near the bevel and on the etchable/mask layer 320.

Figure 9:
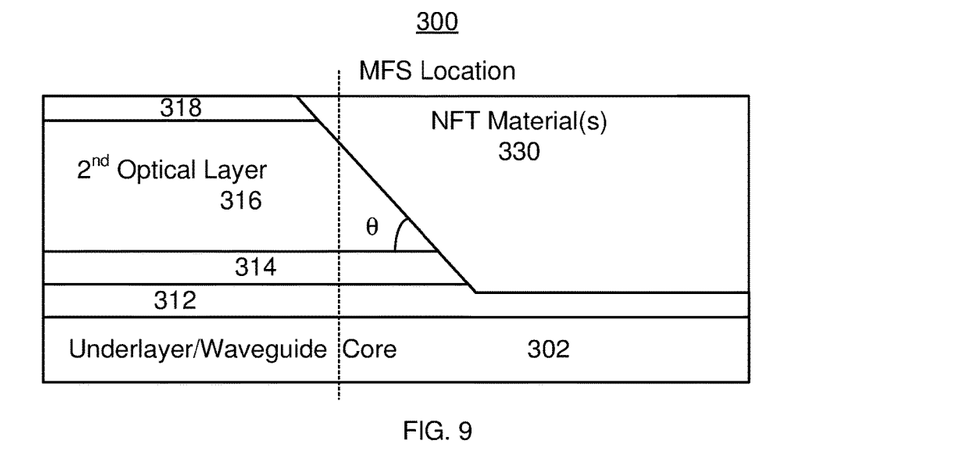

The mask 320 is removed via a wet etch, via step 132. For example, an aluminum oxide wet etch may be used. Part of the adhesion layer may be removed, via step 134. For example, if a bilayer 318/319 is used, then the layer 319 may be removed in step 134. Step 134 may include performing a Cr wet etch. FIG. 9 depicts the HAMR write apparatus 300 after step 134 is performed. Thus, the underlying adhesion layer 318 remains. Also shown are NFT material(s) 330 which may form all of part of the NFT.

Figure 10:
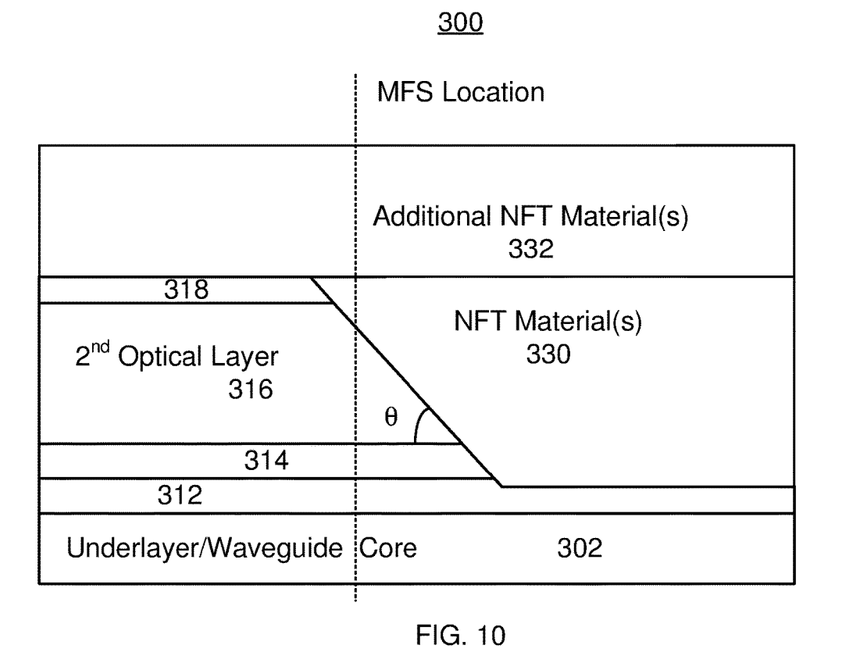

At least one additional NFT material may optionally be deposited, via step 136. FIG. 10 depicts the HAMR write apparatus 300 after step 136 is performed. Thus, the additional NFT material(s) 332 is shown. These material(s) may also be patterned, via step 138. If additional materials are deposited and patterned, then a portion of the NFT being formed may occupy the MFS. In either case, the NFT formed has an NFT front surface at the bevel angle from the MFS location.

Using the method 120, the HAMR write apparatus 300 using NFT materials 330 and, optionally, 332 may be formed. The HAMR write apparatus 300 shares the benefits of the HAMR disk drive 200/200' and write apparatus 230/230'. The bevel in the NFT materials 330/332 results in the peak of the thermal profile of the optical spot being shifted in the down track direction toward the main pole (not shown). The presence of the dielectric gap (not shown) between a portion of the NFT formed using NFT materials 330 and the main pole at and near the MFS shifts the thermal profile in the down track direction toward the main pole for the HAMR write apparatus 300. In addition, the gradient in the thermal profile may be increased. The isothermal lines in the cross-track direction may also be flattened. Thus, writing and reading for the write apparatus 300 may be improved.

Figure 11:
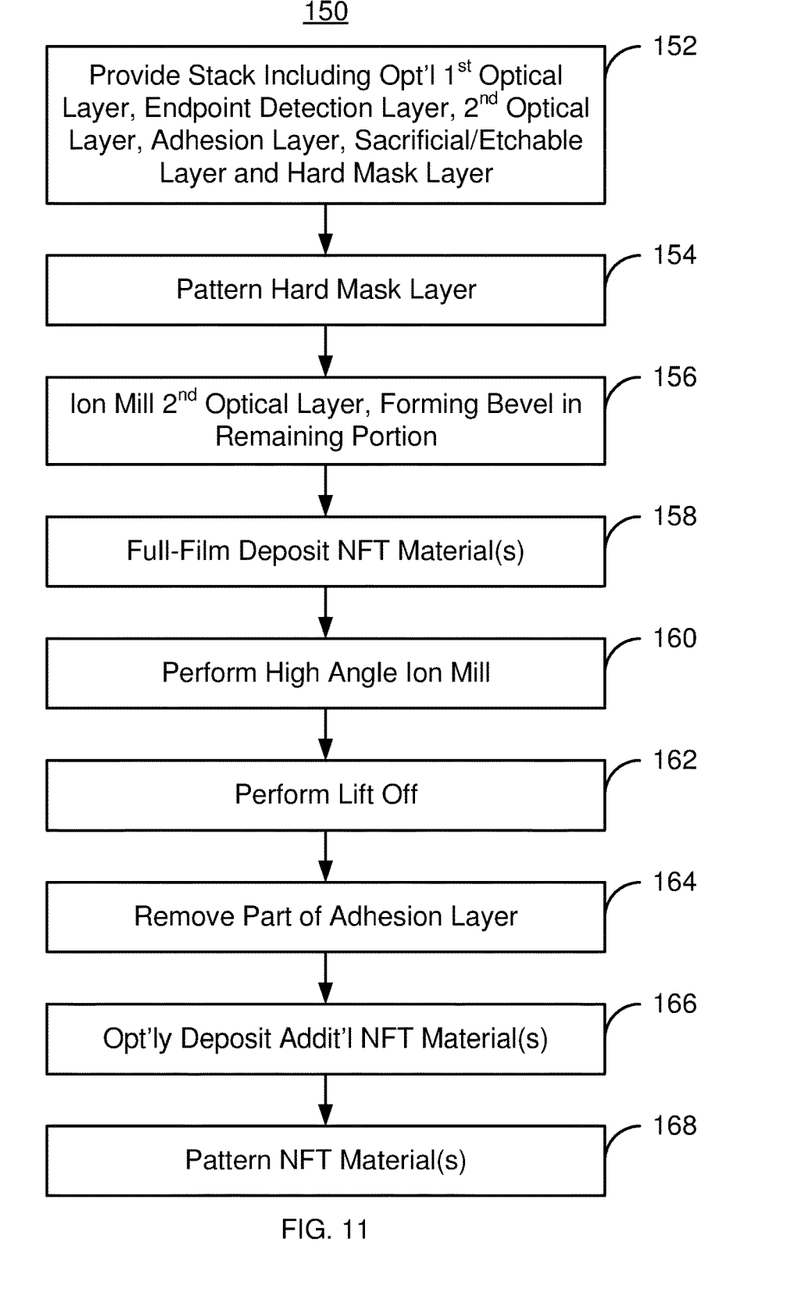
FIG. 11 is a flow chart depicting another exemplary embodiment of a method for fabricating a HAMR write apparatus.

FIG. 11 is a flow chart depicting an exemplary embodiment of a method 150 for fabricating a portion of a HAMR disk drive. For example, the method 150 may primarily be used in forming the NFTs 270 and/or 270'. FIGS. 12-17 depict apex views of another exemplary embodiment of a HAMR write apparatus 300' during fabrication using the method 150. The HAMR write apparatus 300' is analogous to the HAMR write apparatus 300. Consequently, analogous layers have similar labels. For simplicity, some steps may be omitted, performed in another order, interleaved and/or combined. The HAMR write apparatus 300' being fabricated may be part of a data storage device that also includes a read apparatus (not shown) and may reside on a slider. For simplicity, however, the reader is not discussed. The method 150 is described in the context of forming the write apparatus 300'. However, the method 150 may be used to fabricate multiple writers at substantially the same time. The method 150 and system are also described in the context of particular layers. However, in some embodiments, such layers may include multiple sub-layers. The method 150 also may commence after formation of other portions of the data storage device.

A stack for a NFT is provided on an underlayer, via step 152. The underlayer may be the core of the waveguide. The stack includes a first optical layer, an endpoint detection layer, a second optical layer, an adhesion layer, a sacrificial etchable layer and a hard mask layer.

Figure 12:
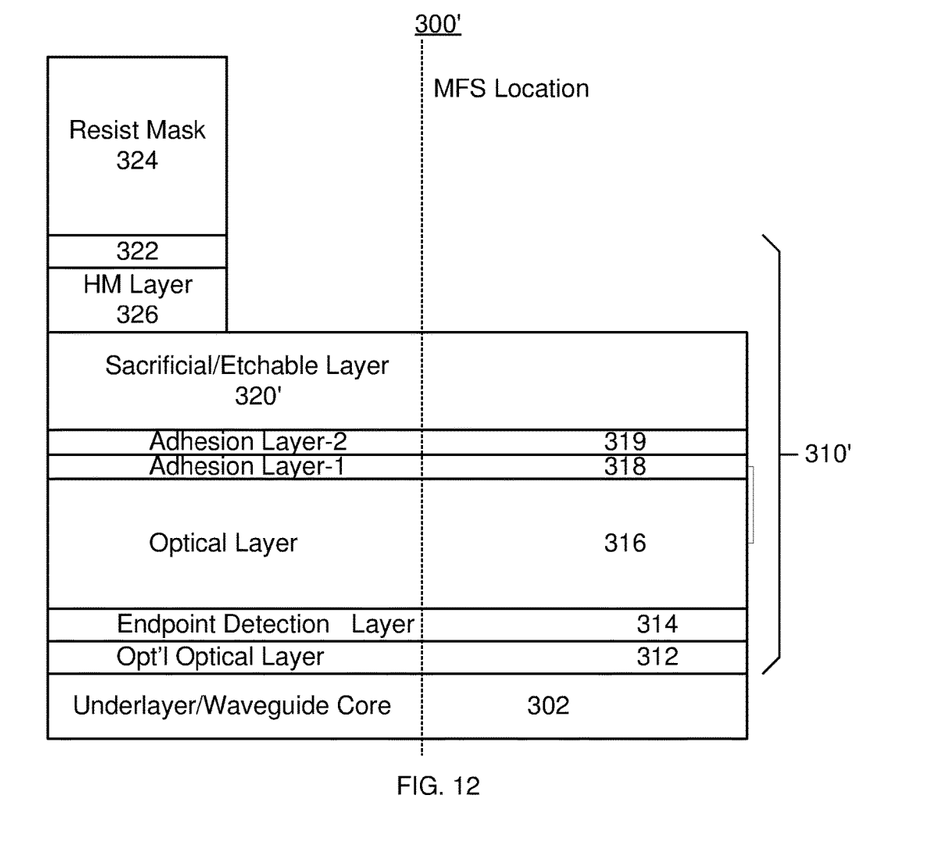
FIGS. 12-17 depict apex views of another exemplary embodiment of a HAMR write apparatus during fabrication.

The hard mask layer is patterned to form a hard mask, via step 154. Step 124 may include providing a photoresist mask and removing a portion of the hard mask layer. FIG. 12 depicts the HAMR write apparatus 300' after step 154. Thus, the stack 310' has been formed on the underlayer 302. The underlayer 302 is a waveguide core layer. The stack 310' includes the first optical layer 312, endpoint detection layer 314, second optical layer 316, adhesion layers 318 and 319, sacrificial etchable layer 320', hard mask layer 326 and mask layer 322. Also shown is the MFS location. The optical layers 312 and 316 may be silicon oxide. The second optical layer 316 may be at least set based on the desired thickness of the bevel of the NFT and the total thickness of the NFT being formed. In some embodiments the silicon oxide layer may be at least fifty nanometers and not more than one hundred nanometers thick. For example, in some embodiments, the second optical layer 316 may be seventy nanometers thick.

The sacrificial etchable layer 320' may be aluminum oxide. Because of the presence of the hard mask layer 326, the etchable layer 320' may be thinner than for the HAMR write apparatus 300. For example, if the etchable layer 320 is on the order of one hundred ten nanometers through one hundred and thirty nanometers, then the sacrificial etchable layer 320' may be at least forty nanometers and not more than sixty nanometers. In some embodiments, the etchable layer 320' is nominally fifty nanometers thick. The endpoint detection layer 314 may be tantalum or tantalum oxide. The adhesion layers 318 and 319 are a bilayer. Thus, adhesion layer 318 may be Rh and adhesion layer 319 may be Cr. The adhesion layers 318 and 319 aid in allowing NFT material(s) such as Au in adhering to the surface. The hard mask layer 326 may be amorphous carbon. The mask layer 322 may be Ta. The waveguide core layer 302 may be tantalum oxide. Also shown is the resist mask 324 used in patterning the lower layer(s). The mask layer 322 and hard mask layer 326 have been patterned, for example via an RIE. Thus, the hard mask layer 326 may form a mask for formation of the NFT. Because an RIE is used, the sidewalls of the hard mask layer 326 are substantially parallel to the MFS location.

Figure 13:
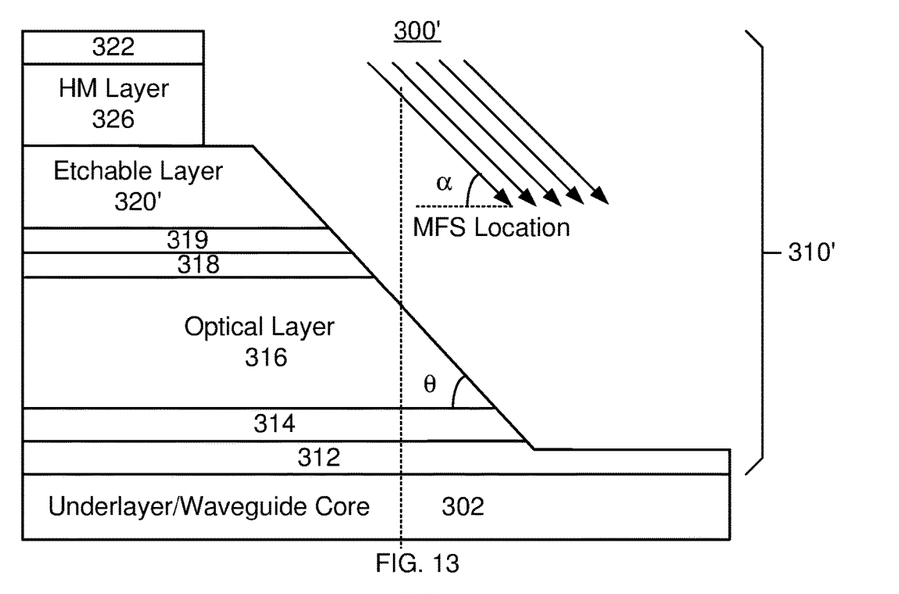

The stack 310' is ion milled at an ion milling angle, via step 156. Thus, at least the second optical layer 316 is milled. The sacrificial etchable layer 320' and adhesion layers 318 and 319 are also milled. The ion milling angle is within five degrees of the desired bevel angle. The ion milling step is terminated in response to detection of the endpoint detection layer 314. In some cases, the endpoint detection layer 314 is milled through. FIG. 13 depicts the HAMR write apparatus 300' while step 156 is performed. Thus, the arrows depict the direction of the ion mill at angle α from perpendicular to the MFS. The sacrificial etchable layer 320', adhesion layers 318 and 319 and, more importantly, the remaining portion of the second optical layer 316 have a bevel at a bevel angle, θ, at and near the MFS location. The bevel angle is at least forty degrees and not more than seventy degrees. The ion milling angle, α, is within five degrees of the bevel angle, θ.

Figure 14:
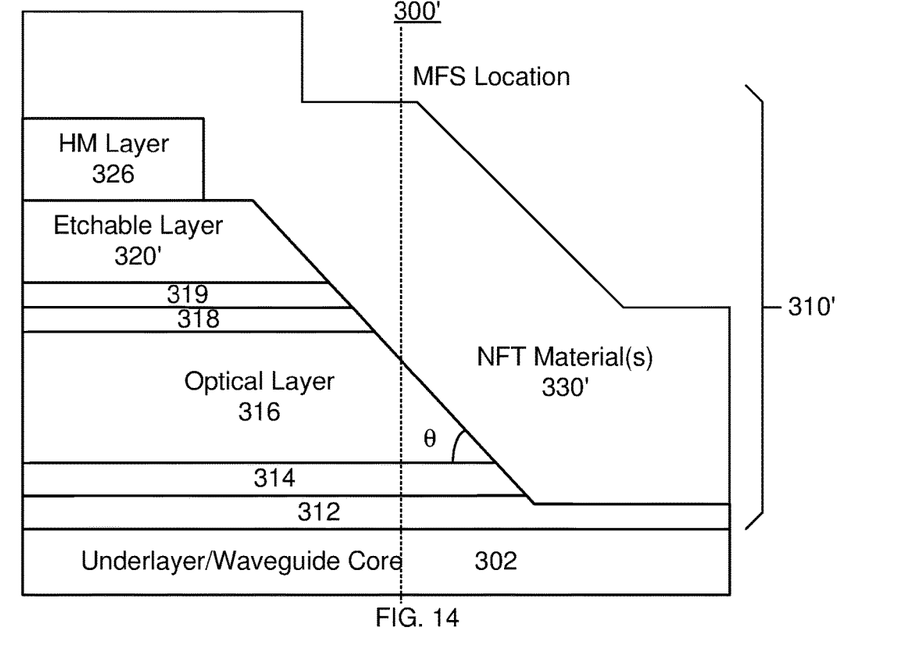

The NFT material(s) are full-film deposited, via step 158. Step 158 may include plating or otherwise depositing materials such as Au used in the NFT. FIG. 14 depicts the HAMR write apparatus 300' after step 158 is performed. Thus, NFT material(s) 330' are shown. A front surface of the material(s) adjoins, or shares an interface with, the bevel of the optical layer 316. Thus, this front surface of the NFT material(s) 330' is at the bevel angle, θ, from the MFS location.

Figure 15:
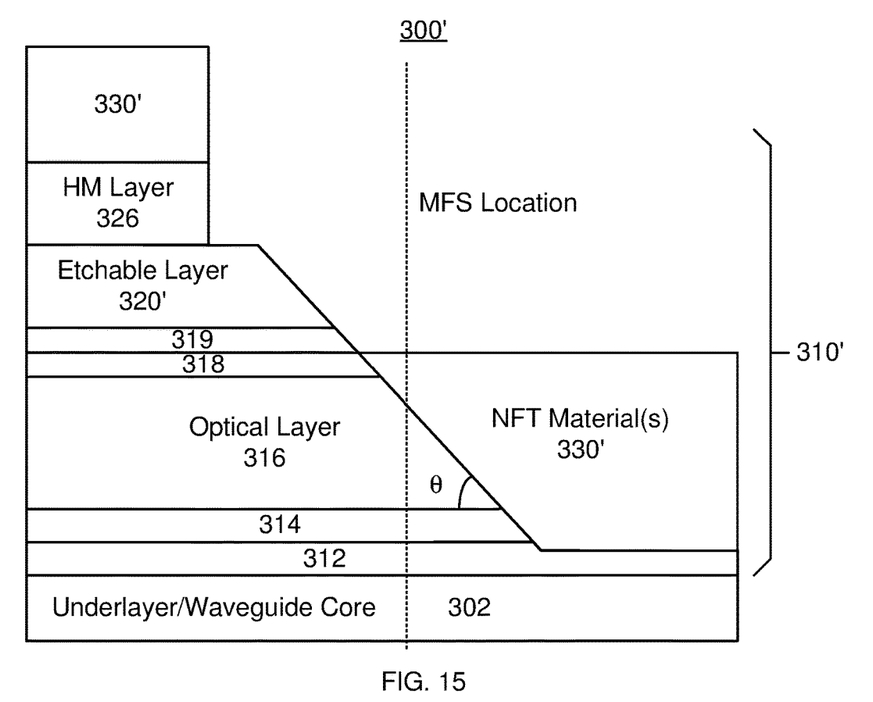

A portion of the NFT material(s) 330' are removed from a side of the mask 320 using a high angle ion mill, via step 160. Step 160 thus may include performing an ion mill at an acute angle from the MFS location. The portion of the NFT material(s) 330' on the side of the hard mask 326 and etchable layer 320' are removed faster than the portions of the NFT material(s) 330 on the layers 316 and 312 and on the top of the hard mask 326. Thus, the NFT material(s) 330' still remain near the bevel for the optical layer 316. FIG. 15 depicts the HAMR write apparatus 300' after step 160 is performed. Thus, the NFT material(s) 330' remain on the bevel of the sacrificial layer 316 and on top of the hard mask 326.

A lift off is performed, via step 162. The sacrificial layer 320' may be removed using a wet etch. For example, an aluminum oxide wet etch may be used.

Figure 16:
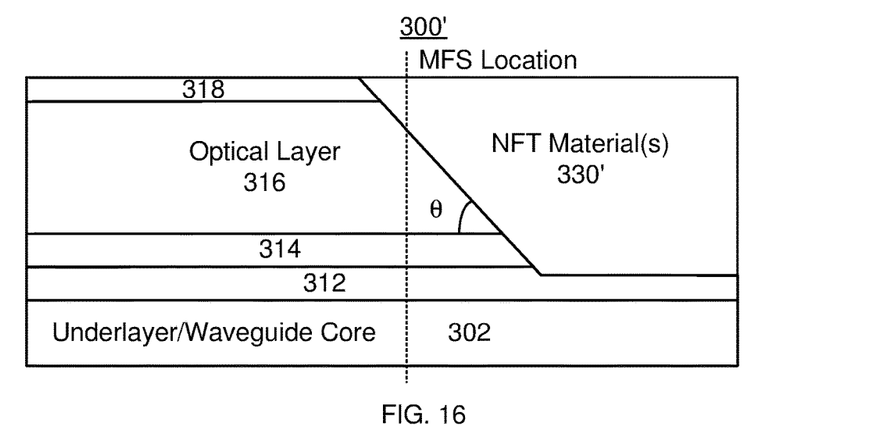

Part of the adhesion layer may be removed, via step 164. For example, if a bilayer 318/319 is used, then the layer 319 may be removed in step 164. Step 164 may include performing a Cr wet etch. FIG. 16 depicts the HAMR write apparatus 300' after step 164 is performed. Thus, the underlying adhesion layer 318 remains. Also shown are NFT material(s) 330' which may form all of part of the NFT.

Figure 17:
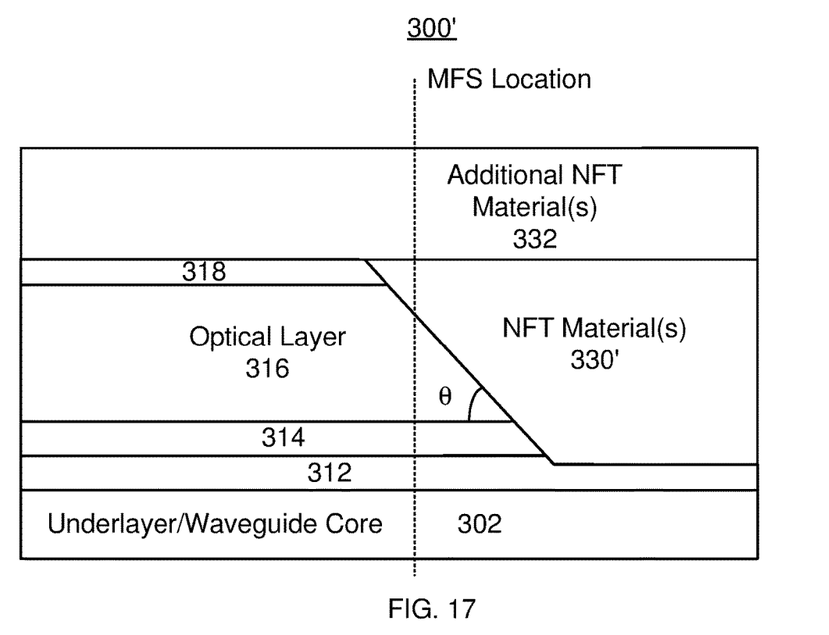

At least one additional NFT material may optionally be deposited, via step 166. FIG. 17 depicts the HAMR write apparatus 300' after step 166 is performed. Thus, the additional NFT material(s) 332 are shown. These material(s) may also be patterned, via step 168. If additional materials are deposited and patterned, then a portion of the NFT being formed may occupy the MFS. In either case, the NFT formed has an NFT front surface at the bevel angle from the MFS location.

Using the method 150, the HAMR write apparatus 300' using NFT materials 330' may be formed. The HAMR write apparatus 300' shares the benefits of the HAMR disk drive 200/200' and write apparatus 230/230'/300. The bevel in the NFT materials 330' results in the peak of the thermal profile of the optical spot being shifted in the down track direction toward the main pole. A dielectric gap (not shown) between a portion of the NFT 330 and the main pole (not shown) at and near the MFS shifts the thermal profile in the down track direction toward the main pole for the HAMR write apparatus 300'. In addition, the gradient in the thermal profile may be increased. The isothermal lines in the cross-track direction may also be flattened. Thus, writing and reading for the write apparatus 300' may be improved.

What is claimed is:

1. A magnetic write apparatus comprising:
  a pole extending in a yoke direction from a media facing surface, wherein the yoke direction extends perpendicular to the media facing surface; and
  a near field transducer comprising a near field transducer cap and a near field transducer nose,
  wherein the near field transducer nose is separated from the pole by the near field transducer cap and a dielectric gap;
  wherein the near field transducer nose comprises a bevel surface that forms a bevel angle with a plane extending in the yoke direction; and
  wherein a thickness of the near field transducer cap is substantially same as a thickness of the dielectric gap in a down track direction that extends parallel to the media facing surface.

2. The magnetic write apparatus of claim 1, wherein the near field transducer cap is separated from the media facing surface by the dielectric gap.

3. The magnetic write apparatus of claim 1, wherein a portion of the dielectric gap is at the media facing surface.

4. The magnetic write apparatus of claim 1, wherein the near field transducer nose comprises a top surface extending in the yoke direction adjacent to the dielectric gap, and wherein the bevel surface is separated from the top surface by a first surface extending parallel to and occupying the media facing surface.

5. The magnetic write apparatus of claim 4, wherein a thickness of the first surface a direction parallel to the media facing surface is at least twenty nanometers.

6. The magnetic write apparatus of claim 1, wherein the near field transducer nose comprises a top surface extending in the yoke direction adjacent to the dielectric gap, and the bevel surface connects to the top surface at the media facing surface.

7. The magnetic write apparatus of claim 1, wherein the bevel surface extends to the media facing surface.

8. The magnetic write apparatus of claim 1, wherein the bevel angle is at least twenty degrees and not more than seventy degrees.

9. The magnetic write apparatus of claim 1, wherein a width of the near field transducer nose in a cross track direction that extends perpendicular to the media facing surface is not more than fifty nanometers, and wherein a thickness of the near field transducer in the down track direction is at least fifty nanometers and not more than one hundred and twenty five nanometers.

10. The magnetic write apparatus of claim 1, wherein the dielectric gap comprises silicon oxide.

11. The magnetic write apparatus of claim 1, wherein a width of the dielectric gap in a cross track direction that extends perpendicular to the media facing surface is less than a width of the near field transducer nose in the cross track direction.

12. A magnetic write apparatus comprising:
a near field transducer comprising:
a near field transducer cap having a first surface distal from a media facing surface and a second surface proximate to the media facing surface;
a near field transducer nose having a first surface distal from the media facing surface and a bevel surface extending to the media facing surface, wherein the first surface of the near field transducer nose extends farther from the media facing surface than the first surface of the near field transducer cap in a yoke direction that is perpendicular to the media facing surface; and
a dielectric separating the near field transducer cap from the media facing surface,
wherein the bevel surface extends to a top surface of the near field transducer nose, the top surface extending in the yoke direction.

13. The magnetic write apparatus of claim 12, wherein the bevel surface forms a bevel angle with a plane extending in the yoke direction.

14. The magnetic write apparatus of claim 12, wherein a thickness of the near field transducer cap is substantially same as a thickness of the dielectric in a down track direction that extends parallel to the media facing surface.

15. A magnetic write apparatus comprising:
a near field transducer comprising a near field transducer cap and a near field transducer nose; and
a waveguide configured to receive energy from a laser and direct the energy to the near field transducer,
wherein the near field transducer nose comprises a bevel surface that forms a bevel angle with a plane extending in a yoke direction that is perpendicular to a media facing surface of the magnetic write apparatus,
wherein the bevel surface extends to the media facing surface; and
wherein the near field transducer nose comprises a top surface that extends in a single plane in the yoke direction from a back surface of the near field transducer nose to the media facing surface.

16. The magnetic write apparatus of claim 15, wherein the near field transducer cap is separated from the media facing surface by a dielectric.

17. The magnetic write apparatus of claim 16, wherein the dielectric and a cladding of the waveguide are constructed of a same material.

18. The magnetic write apparatus of claim 15, wherein the bevel surface one of extends to the top surface and is separated from the top surface by a first surface extending between the top surface and the bevel surface and occupying the media facing surface.

19. The magnetic write apparatus of claim 1, wherein the near field transducer nose extends farther than the near field transducer cap in the yoke direction from the media facing surface.

20. The magnetic write apparatus of claim 15, wherein the back surface of the near field transducer nose extends farther from the media facing surface in the yoke direction than a back surface of the near field transducer cap.

* * * * *